United States Patent
Kung et al.

(10) Patent No.: US 11,011,635 B2
(45) Date of Patent: May 18, 2021

(54) METHOD OF FORMING CONFORMAL EPITAXIAL SEMICONDUCTOR CLADDING MATERIAL OVER A FIN FIELD EFFECT TRANSISTOR (FINFET) DEVICE

(71) Applicant: Applied Materials, Inc., Santa Clara, CA (US)

(72) Inventors: Sheng-Chin Kung, Milpitas, CA (US); Hua Chung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/839,024

(22) Filed: Dec. 12, 2017

(65) Prior Publication Data

US 2018/0166570 A1    Jun. 14, 2018

Related U.S. Application Data

(60) Provisional application No. 62/432,869, filed on Dec. 12, 2016.

(51) Int. Cl.
| | |
|---|---|
| *H01L 29/00* | (2006.01) |
| *H01L 29/78* | (2006.01) |
| *H01L 29/66* | (2006.01) |
| *H01L 21/02* | (2006.01) |
| *H01L 29/10* | (2006.01) |
| *H01L 29/161* | (2006.01) |

(52) U.S. Cl.
CPC ...... *H01L 29/7848* (2013.01); *H01L 21/0243* (2013.01); *H01L 21/0262* (2013.01); *H01L 21/02532* (2013.01); *H01L 29/1054* (2013.01); *H01L 29/66* (2013.01); *H01L 29/66795* (2013.01); *H01L 29/785* (2013.01); *H01L 29/161* (2013.01)

(58) Field of Classification Search
CPC ............ H01L 29/7848; H01L 21/0243; H01L 21/02532
See application file for complete search history.

(56) References Cited

U.S. PATENT DOCUMENTS

| | | | |
|---|---|---|---|
| 6,897,131 B2 | 5/2005 | Ramachandran et al. |
| 7,078,302 B2 | 7/2006 | Ma et al. |
| 7,132,338 B2 | 11/2006 | Samoilov et al. |
| 7,166,528 B2 | 1/2007 | Kim et al. |
| 7,235,492 B2 | 6/2007 | Samoilov |
| 7,312,128 B2 | 12/2007 | Kim et al. |
| 7,439,142 B2 | 10/2008 | Samoilov et al. |
| 7,517,775 B2 | 4/2009 | Kim et al. |

(Continued)

OTHER PUBLICATIONS

PCT/US2017/065791, International Search Report dated Apr. 6, 2018, 12 pages.

(Continued)

*Primary Examiner* — Mounir S Amer
*Assistant Examiner* — Alexander Belousov
(74) *Attorney, Agent, or Firm* — Patterson + Sheridan, LLP

(57) ABSTRACT

The present disclosure generally relates to devices having conformal semiconductor cladding materials, and methods of forming the same. The cladding material is a silicon germanium epitaxial material. The cladding material is capable of being deposited to a thickness which is less than cladding materials formed by conventional deposition/etch techniques.

22 Claims, 3 Drawing Sheets

(56) References Cited

U.S. PATENT DOCUMENTS

| | | | |
|---|---|---|---|
| 7,521,365 B2 | 4/2009 | Kim et al. | |
| 7,540,920 B2 | 6/2009 | Singh et al. | |
| 7,560,352 B2 | 7/2009 | Carlson et al. | |
| 7,572,715 B2 | 8/2009 | Kim et al. | |
| 7,611,976 B2 | 11/2009 | Ma et al. | |
| 7,645,339 B2 | 1/2010 | Singh et al. | |
| 7,682,940 B2 | 3/2010 | Ye et al. | |
| 7,732,269 B2 | 6/2010 | Kim et al. | |
| 7,732,305 B2 | 6/2010 | Ye et al. | |
| 7,737,007 B2 | 6/2010 | Samoilov et al. | |
| 7,758,697 B2 | 7/2010 | Comita et al. | |
| 7,960,256 B2 | 6/2011 | Ye et al. | |
| 8,093,154 B2 | 1/2012 | Zojaji et al. | |
| 8,445,389 B2 | 5/2013 | Zojaji et al. | |
| 8,492,284 B2 | 7/2013 | Samoilov | |
| 8,501,594 B2 | 8/2013 | Huang et al. | |
| 8,586,456 B2 | 11/2013 | Ye et al. | |
| 8,642,454 B2 | 2/2014 | Brabant et al. | |
| 2006/0113605 A1* | 6/2006 | Currie | H01L 21/823807 |
| | | | 257/368 |
| 2007/0066023 A1 | 3/2007 | Thakur et al. | |
| 2007/0224830 A1 | 9/2007 | Samoilov | |
| 2010/0099241 A1 | 4/2010 | Murano et al. | |
| 2011/0053361 A1* | 3/2011 | Muralidhar | H01L 21/3086 |
| | | | 438/585 |
| 2011/0193141 A1 | 8/2011 | Lin et al. | |
| 2012/0138897 A1* | 6/2012 | Lin | H01L 21/02381 |
| | | | 257/19 |
| 2013/0126985 A1 | 5/2013 | Cheng et al. | |
| 2015/0170916 A1* | 6/2015 | Yu | H01L 21/02664 |
| | | | 438/493 |
| 2015/0318169 A1 | 11/2015 | Qi et al. | |
| 2016/0126093 A1 | 5/2016 | Dube et al. | |

OTHER PUBLICATIONS

Destefanis, V. et al; "Low-thermal surface preparation, HCI etch and Si/Sige selective epitaxy on (1 1 0) silicon surfaces", Semiconductor Science and Technology. 23 Sep. 16, 2008.

Destefanis, V. et al; "Fabrication, structural and electrical properties of (1 1 0) localized silicon-on-insulator devices", Semiconductor Science and Technology 25, Feb. 5, 2010.

Nanda, Rajib K. et al; "Beyond Silicon: Strained-SiGe Channel FinFETs", International Conference on Man and Machine Interfacing (MAMI), 2015.

Taiwan Office Action dated Apr. 26, 2019 for Application No. 106143536.

Taiwan Office Action dated Apr. 10, 2020 for Application No. 106143536.

* cited by examiner

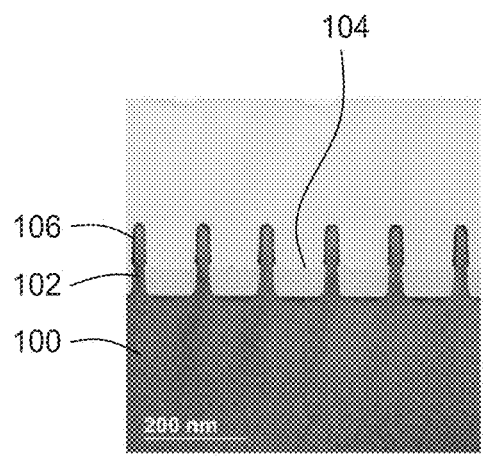
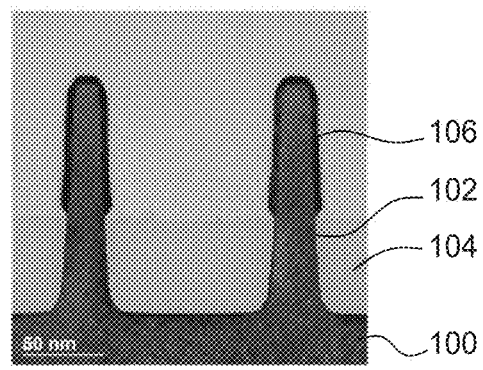
FIG. 2A  FIG. 2B
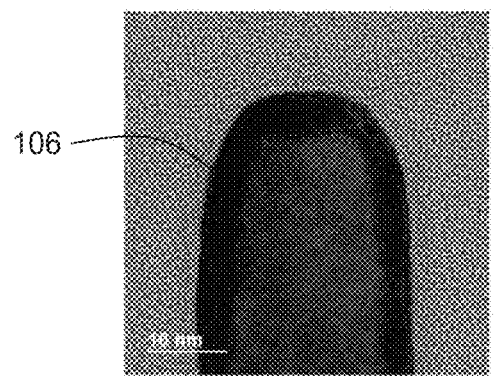
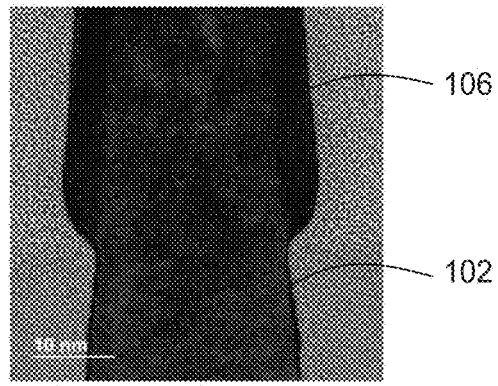
FIG. 2C  FIG. 2D

METHOD OF FORMING CONFORMAL EPITAXIAL SEMICONDUCTOR CLADDING MATERIAL OVER A FIN FIELD EFFECT TRANSISTOR (FINFET) DEVICE

CROSS-REFERENCE TO RELATED APPLICATIONS

This application claims benefit of U.S. Provisional Patent Application Ser. No. 62/432,869, filed Dec. 12, 2016, which is herein incorporated by reference.

BACKGROUND

Field

Embodiments of the present disclosure generally relate to semiconductor devices having conformal semiconductor cladding materials, and methods of forming the same.

Description of the Related Art

Incorporation of high mobility strained channels into fin-based transistors provides desired stress into channels regions of a device. However, conventional techniques of forming a stress material onto the fins of a device can cause the device to functional at a lower level than designed, or worse, can result in the device being scrapped due to inadvertent merging of the stress material with a fin, which can result in an electrical short.

What is needed is a method of forming a conformal epitaxial semiconductor cladding material over semiconductor devices.

SUMMARY

In one embodiment, a method of forming a strained channel layer comprises exposing one or more three-dimensional feature on a substrate to a silicon-containing precursor and germanium-containing precursor comprising chlorine to form an epitaxial silicon-germanium channel layer on intersecting surfaces the one or more features, the intersecting surfaces having different crystallographic orientations.

In another embodiment, a method of forming a strained channel layer comprises exposing one or more vertical fins on a substrate to a silicon-containing precursor and germanium-containing precursor to selectively form an epitaxial silicon-germanium strained channel layer on exposed horizontal and vertical surfaces of the one or more vertical fins, the exposed horizontal and vertical surfaces having different crystallographic orientations selected from <100> and <110> planes, wherein the germanium-containing precursor comprises chlorine.

In another embodiment, a device comprises a substrate having a plurality of vertical fins extending from a surface thereof, and an epitaxial silicon-germanium strained channel layer formed conformally over horizontal and vertical surfaces of surfaces of the plurality of vertical fins, the horizontal and vertical surfaces having different crystallographic orientations, wherein the epitaxial silicon-germanium strained channel layer has a uniform germanium concentration and a thickness less than five nanometers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIGS. 2A-2D illustrate TEM photographs of a strained channel layer of FIG. 1B, according to one embodiment of the disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to devices having conformal semiconductor cladding materials, and methods of forming the same. The cladding material is a silicon germanium epitaxial material. The cladding material is capable of being deposited to a thickness which is less than cladding materials formed by conventional deposition/etch techniques, while still maintaining a desired uniformity.

Figure 1A:
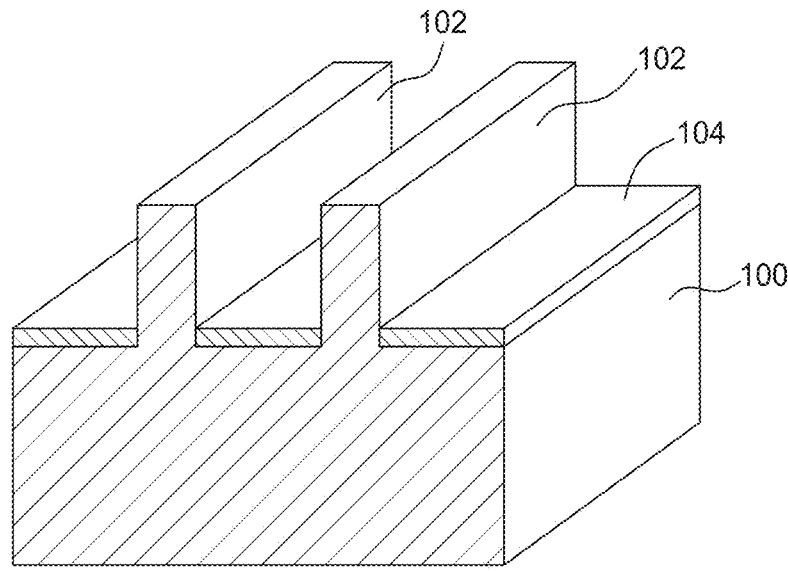
FIGS. 1A-1C are schematic sectional views of a substrate during operations of FINFET formation, according to embodiments of the disclosure.
Figure 1B:
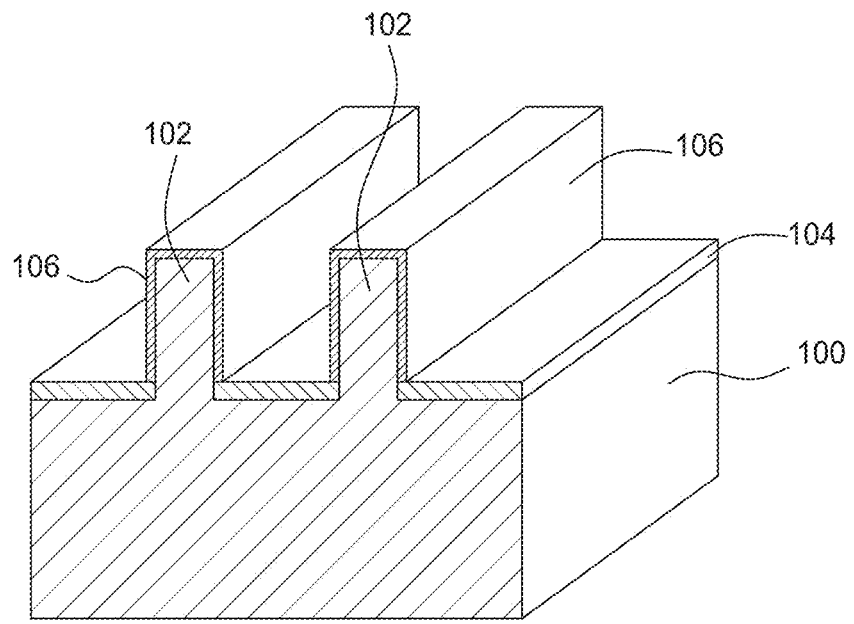
Figure 1C:
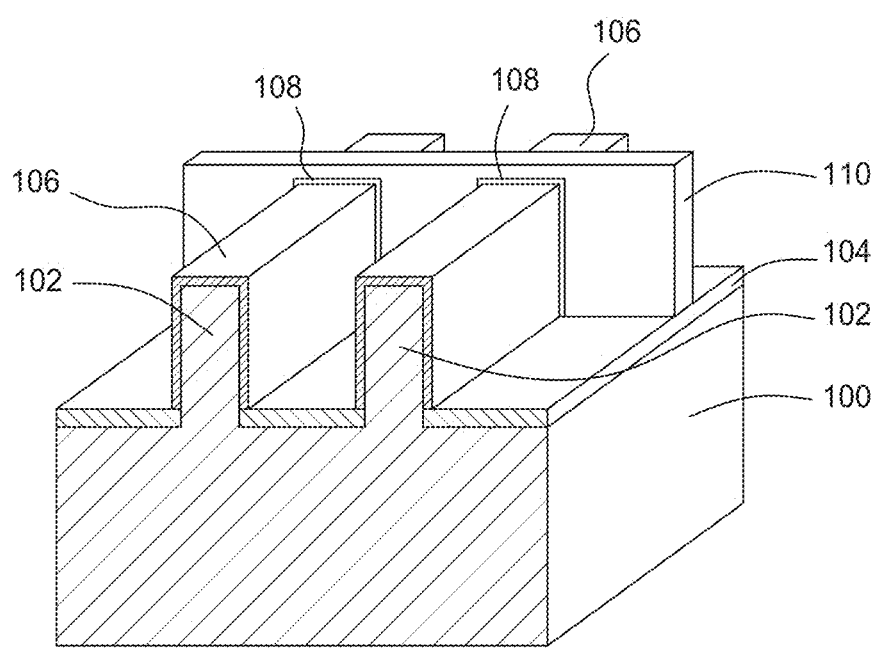

FIGS. 1A-1C are schematic sectional views of a substrate during operations of FINFET formation, according to embodiments of the disclosure. FIG. 1A illustrates a substrate 100 having vertical fins 102 and a shallow trench isolation (STI) layer 104 therein. The substrate 100 may be a bulk silicon substrate, silicon-on insulator (SOI) substrate, germanium substrate, or the like. The vertical fins 102 extend vertically from an upper surface of the substrate 100. The vertical fins 102 are formed by masking and etching an upper surface of the substrate 100, resulting in the vertical fins 102. However, other formation methods are also contemplated. The vertical fins 120 include channel dopings, which are introduced through implantation of the vertical fins 102. The STI 104 is disposed between the vertical fins 102 on an upper surface of the substrate 100. The STI 104 facilitates electrical isolation between devices formed on the substrate 100. As illustrated in FIG. 1A, the vertical fins 102 extend a distance above the upper surface of the STI 104. In one example, the STI 104 is formed from one or more of silicon dioxide, silicon nitride, or silicon oxynitride. However, other dielectric materials are contemplated.

After formation of the vertical fins 102 and the STI 104, strained channel layers 106 are formed on surfaces of the vertical fins 102, as shown in FIG. 1B. The strained channel layer 106 is formed during an epitaxial deposition process, and thus, has a crystallographic orientation which corresponds to the crystallographic orientation of the vertical fins 102. In one example, the strained channel layer 106 is epitaxial silicon germanium ($Si_{(1-x)}Ge_x$). The presence of the strained channel layer 106 induces a desired stress into the channel region of a device, source/drain regions of a device, or both. In one example, the strained channel layer 106 functions as a junction material.

The strained channel layer 106 is formed by exposing the vertical fins 102 to a gas mixture including one or more germanium precursors and one or more silicon precursors. The Ge fraction in the strained channel layer 106 may range from about 5 percent to about 75 percent in $Si_{(1-x)}Ge_x$; e.g.

$Si_{0.95}Ge_{0.05}$ to $Si_{0.25}Ge_{0.75}$. The one or more germanium precursors may include germanium tetrachloride ($GeCl_4$), chlorogermane ($GeH_3Cl$), dichlorogermane ($GeH_2Cl_2$), trichlorogermane ($GeHCl_3$), hexachlorodigermane ($Ge_2Cl_6$), octachlorotrigermane ($Ge_3Cl_8$). The one or more silicon precursors may include silane ($SiH_4$), disilane ($Si_2H_6$), trisilane ($Si_3H_8$), tetrasilane ($Si_4H_{10}$), pentasilane ($Si_5H_{12}$). An optional carrier gas may be utilized, including diatomic hydrogen or diatomic nitrogen. It is to be noted that other germanium and silicon precursors are contemplated. In one example, the substrate 100 is maintained at a temperature within a range of about 560 degrees Celsius to about 700 degrees Celsius. A pressure within a processing chamber is maintained at a pressure of about 5 torr to about 80 torr. Each of the silicon precursor and the germanium precursor is provided at a flow rate of about 100 sccm to about 1200 sccm, however, other flow rates are contemplate depending upon substrate size. A carrier gas of diatomic nitrogen or diatomic hydrogen may be utilized to facilitate flow of the germanium precursor and the silicon precursor.

In a specific example of depositing an epitaxial silicon-germanium strained channel layer conformally over one or more vertical and horizontal surfaces of a vertical fins, the silicon precursor is provided at a flow rate of about 15 sccm to about 45 sccm, and a germanium precursor is provided at a flow rate of about 100 sccm to about 1000 sccm. In such an example, the ratio of silicon precursor to germanium precursor is about 1:2 to about 1:67.

The substrate 100 having the vertical fins 102 thereon is exposed to the germanium precursor and the silicon precursor in a cyclical process (e.g., atomic layer deposition), or simultaneously (e.g., chemical vapor deposition). In one example, the strained channel layer 106 is formed in a low pressure chemical vapor deposition process, such as at about 5 torr to about 80 torr. Additionally or alternatively, the silicon precursor and/or the germanium precursor is ionized or radicalized to facilitate deposition of material on the vertical fins 102. In one example, the strained channel layer 106 may be deposited to a thickness less than 10 nanometers, such as about less than 5 nanometers, or about 2 nanometers or less. In such an example, quantum confinement may be observed once the thickness of the strained channel layer 106 is of the same magnitude of the de Broglie wavelength of the electron wave function. When materials are deposited to such a thickness, the electronic and optical properties of the deposited material deviate from those of bulk materials. Benefits may include, for example, enhancement in drain current, lower power consumption, and/or lower threshold voltages to turn on resistors, In such an example, the vertical fins 102 serve a structural support allowing the strained channel layer 106 to be grown thereon. Because the vertical fins 102 provide structural support, the strained channel layer 106 may be formed having a relatively smaller thickness, as described above, thus improving device performance via higher current flow by reducing junction width.

Conventional epitaxially grown silicon germanium is formed with facets due to the crystalline orientation (i.e., face-centered cubic) of the silicon germanium, as well as the use of HCl which is generally used in conventional silicon germanium formation in FINFET devices. The inclusion of facets generally results in non-uniform film deposition. However, the strained channel layer 106 is formed with significantly reduced number of facets compared to conventional approaches. In addition, the strained channel layer 106 also has uniform silicon and germanium concentrations throughout, in contrast to conventional silicon germanium layers. In conventional silicon germanium layers, germanium concentrations are generally greater in horizontal (e.g., <100>) planes as compared to vertical (e.g., <110>) planes. Additionally, growth rates of a material may differ significantly on <100> and <110> planes, resulting in films of non-uniform thickness. The strained channel layer 106 does not suffer from the same concentration and/or thickness non-uniformities of conventional layers.

Benefits of the present disclosure may be achieved by using a chlorine-containing germanium precursor. Chlorine-containing germanium precursors, such as those described above, are selective against oxide and nitride materials. Therefore, using the process chemistries described above, the strained channel layer 106 is formed on exposed surfaces of the vertical fins 102, but silicon germanium material is generally not deposited on the exposed surfaces of the STI 104. Moreover, the process chemistry described herein facilitates uniform growth rates on both the <100> and <110> planes across a wide range of process conditions.

In one example, a strained channel layer 106 may be grown as described above. At about 650 degrees Celsius and about 10 torr, the growth rate of <100> plane is about 162 angstroms per minute, with a germanium concentration of about 27 atomic percent. In the <110> plane, the growth rate is about 165 angstroms per minute, and the germanium concentration is about 26 atomic percent. In another example, at about 600 degrees Celsius and about 15 torr, the growth rate in the <100> plane is about 87 angstroms per minute, and the germanium concentration is about 30 percent. In the <110> plane, growth rate is about 92 angstroms per minute, and the germanium concentration is about 28 percent. In one example, the growth rates in the <100> plane and in the <110> plane are within 3 percent of one another, such as 2 percent of one another, or within 1.5 percent of one another, or within 1.0 percent of one another.

As illustrated in FIG. 1C, after formation of the strained channel layer 106, a gate dielectric 108 and a gate material 110 are formed over the strained channel layer. The gate dielectric 108 is located between the strained channel layer 106 and the gate material 110 to facilitate electrical isolation therebetween. The gate dielectric 108 may be formed of silicon oxide, silicon nitride, hafnium oxide, hafnium silicon oxynitride and/or hafnium silicon oxide. The gate material 110 may be formed of polysilicon, amorphous silicon, germanium, silicon germanium, metals, and/or metal alloys.

FIGS. 2A-2D illustrate TEM photographs of a strained channel layer 106 formed over a substrate 100, according to one embodiment of the disclosure. The strained channel layer 106 is formed conformally over vertical fins 102. The strained channel layer 106 is an epitaxial silicon germanium layer having a uniform thickness and concentration throughout. Additionally, because the strained channel layer 106 deposits selectively on exposed surfaces of the vertical fins 102, and not on the exposed surfaces of the STI 104, etching operations to remove material from the STI are unnecessary. Thus, formation of the strained channel layer 106 is more efficient than conventional approaches.

While one example of a FINFET is illustrated, other devices are also contemplated. For example, embodiments herein may be used for double-gate, trigate, and similar FINFET structures, as well as other features. Uses in devices other than FINFETs are also contemplated. Moreover, while embodiments herein may be described with respect to strained channel layers, application of disclosed embodiments with respect to unstrained channel layers is also contemplated Benefits of the disclosure include the application of strained gate channels which may be deposited more uniformly and of smaller scale than conventional strained gate channels. Additionally, the formation process described herein for the strained gate channels utilizes a selective deposition process, thereby reducing process time by eliminating certain masking and etching processes.

While the foregoing is directed to embodiments of the present disclosure, other and further embodiments of the disclosure may be devised without departing from the basic scope thereof, and the scope thereof is determined by the claims that follow.

What is claimed is:

1. A method of forming a strained channel layer, comprising:
    forming a shallow trench isolation layer on an upper surface of a substrate containing one or more three-dimensional features, wherein the shallow trench isolation layer is formed between the three-dimensional features which extend from the upper surface, and wherein the shallow trench isolation layer comprises silicon oxide, silicon nitride, or silicon oxynitride; and
    exposing the one or more three-dimensional features on the substrate to a silicon-containing precursor and a germanium-containing precursor comprising chlorine to selectively and conformally form an epitaxial silicon-germanium strained channel layer on intersecting surfaces of the one or more three-dimensional features while maintaining exposed surfaces of the shallow trench isolation layer free of the epitaxial silicon-germanium strained channel layer, the intersecting surfaces having different crystallographic orientations and comprising a vertical surface and a horizontal surface, and wherein the entirety of the epitaxial silicon-germanium strained channel layer has a substantially equal thickness across the vertical surface and the horizontal surface of the one or more three-dimensional features.

2. The method of claim 1, wherein the substrate is maintained at a temperature within a range of about 560 degrees Celsius to about 700 degrees Celsius during the exposing.

3. The method of claim 1, wherein the germanium-containing precursor comprises one or more compounds selected from the group consisting of germanium tetrachloride ($GeCl_4$), chlorogermane ($GeH_3Cl$), dichlorogermane ($GeH_2Cl_2$), trichlorogermane ($GeHCl_3$), hexachlorodigermane ($Ge_2Cl_6$), and octachlorotrigermane ($Ge_3Cl_8$).

4. The method of claim 1, wherein the silicon-containing precursor comprises one or more compounds selected from the group consisting of silane ($SiH_4$), disilane ($Si_2H_6$), trisilane ($Si_3H_8$), and tetrasilane ($Si_4H_{10}$).

5. The method of claim 1, wherein the epitaxial silicon-germanium strained channel layer is deposited conformally over the one or more three-dimensional features.

6. The method of claim 1, wherein the one or more three-dimensional features comprise vertical fins.

7. The method of claim 6, wherein the vertical fins comprise silicon.

8. The method of claim 1, wherein the epitaxial silicon-germanium strained channel layer has about equal deposition rates on <100> and <110> planes.

9. The method of claim 1, wherein a FINFET device is formed on the substrate.

10. The method of claim 1, further comprising:
    forming a gate dielectric over the epitaxial silicon-germanium strained channel layer; and
    forming a gate material over the gate dielectric.

11. The method of claim 10, wherein the gate dielectric comprises silicon oxide, silicon nitride, hafnium oxide, hafnium silicon oxynitride, hafnium silicon oxide, or any combination thereof, and wherein the gate material comprises polysilicon, amorphous silicon, germanium, silicon germanium, or any combination thereof.

12. The method of claim 1, wherein the epitaxial silicon-germanium strained channel layer has a thickness of 2 nm to less than 10 nm.

13. A method of forming a strained channel layer, comprising:
    forming a shallow trench isolation layer on an upper surface of a substrate containing one or more vertical fins, wherein the shallow trench isolation layer is formed between the vertical fins which extend from the upper surface, and wherein the shallow trench isolation layer comprises silicon oxide, silicon nitride, or silicon oxynitride; and
    exposing the one or more vertical fins on the substrate to a silicon-containing precursor and a germanium-containing precursor to selectively and conformally form an epitaxial silicon-germanium strained channel layer on exposed horizontal and vertical surfaces of the one or more vertical fins while not forming the epitaxial silicon-germanium strained channel layer on exposed surfaces of the shallow trench isolation layer, the exposed horizontal and vertical surfaces having different crystallographic orientations selected from <100> and <110> planes, wherein the germanium-containing precursor comprises chlorine, and wherein the entirety of the epitaxial silicon-germanium strained channel layer has a substantially equal thickness across the vertical surface and the horizontal surface of the one or more vertical fins.

14. The method of claim 13, wherein the germanium-containing precursor comprises one or more compounds selected from the group consisting of germanium tetrachloride ($GeCl_4$), chlorogermane ($GeH_3Cl$), dichlorogermane ($GeH_2Cl_2$), trichlorogermane ($GeHCl_3$), hexachlorodigermane ($Ge_2Cl_6$), and octachlorotrigermane ($Ge_3Cl_8$).

15. The method of claim 13, wherein the silicon-containing precursor comprises one or more compounds selected from the group consisting of silane ($SiH_4$), disilane ($Si_2H_6$), trisilane ($Si_3H_8$), and tetrasilane ($Si_4H_{10}$).

16. The method of claim 13, wherein the epitaxial silicon-germanium strained channel layer is deposited conformally over the one or more vertical fins.

17. The method of claim 13, wherein the vertical fins comprise silicon.

18. The method of claim 13, wherein the epitaxial silicon-germanium strained channel layer has about equal deposition rates on <100> and <110> planes.

19. The method of claim 13, further comprising forming a FINFET device on the substrate.

20. The method of claim 13, further comprising:
    forming a gate dielectric over the epitaxial silicon-germanium strained channel layer; and
    forming a gate material over the gate dielectric.

21. The method of claim 20, wherein the gate dielectric comprises silicon oxide, silicon nitride, hafnium oxide, hafnium silicon oxynitride, hafnium silicon oxide, or any combination thereof, and wherein the gate material comprises polysilicon, amorphous silicon, germanium, silicon germanium, or any combination thereof.

22. The method of claim 13, wherein the epitaxial silicon-germanium strained channel layer has a thickness of 2 nm to less than 10 nm.

\* \* \* \* \*